(12) United States Patent
DeFalco et al.

(10) Patent No.: US 6,803,821 B1
(45) Date of Patent: Oct. 12, 2004

(54) SWITCHABLE AMPLIFIER CIRCUIT HAVING REDUCED SHUTDOWN CURRENT

(75) Inventors: John A. DeFalco, Marlborough, MA (US); Mikhail S. Shirokov, Methuen, MA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/406,334

(22) Filed: Apr. 3, 2003

(51) Int. Cl.[7] ............................................. H03F 3/04
(52) U.S. Cl. ................................... 330/288; 330/296
(58) Field of Search ........................ 330/51, 251, 288, 330/296, 298; 323/315, 316

(56) References Cited

U.S. PATENT DOCUMENTS

| | | | | | |
|---|---|---|---|---|---|
| 4,122,401 | A | * | 10/1978 | Sauer | 330/257 |
| 5,517,143 | A | * | 5/1996 | Gross | 327/108 |
| 6,191,656 | B1 | * | 2/2001 | Nadler | 330/288 |
| 6,281,730 | B1 | * | 8/2001 | Vu | 327/170 |

* cited by examiner

*Primary Examiner*—Steven J. Mottola
(74) *Attorney, Agent, or Firm*—Thomas R. FitzGerald, Esq.

(57) ABSTRACT

A switchable amplifier circuit having a current mirror. The mirror includes: a first current source for producing a reference current; an output transistor having an input electrode and an output electrode; and a current gain device connected between an output of the first current source and the input electrode of the output transistor. A bias current is produced through the output electrode of the output transistor, such bias current being a function of the reference current produced by the first current source. A second current source has an output coupled to an input of the current gain device. The second current source provides a current which is a fraction of the reference current. A switching transistor has an output electrode coupled to: (1) an input of the current gain device; and, (2) an output of the second current source. The switching transistor: (1) sinks the current from the second current source in response to an input signal fed to such switching transistor inhibiting current from the second current source to pass to the current gain device and thereby remove the bias current for the output transistor driving the output transistor to a non-conducting condition; or (2) enables the current from the second current source to pass to the current gain device in response to the input signal fed to such switching transistor driving the output transistor to a conducting condition.

10 Claims, 2 Drawing Sheets

SWITCHABLE AMPLIFIER CIRCUIT HAVING REDUCED SHUTDOWN CURRENT

TECHNICAL FIELD

This invention relates to amplifiers, and more particularly to switchable power amplifiers.

BACKGROUND

As is known in the art, power amplifiers are used in a wide variety of applications. One such application is in telephones, such as battery operated cell phones, to amplify radio frequency (RF) signals.

As is also known in the art, such RF amplifiers are typically biased to a proper direct current (dc) operating point using a current mirror 9. One such an arrangement is shown in FIG 1. Here, the amplifier includes an RF grounded emitter output transistor $Q_{RF}$. The base of the RF transistor is fed input RF signals. The base of the output transistor is also coupled to a switching transistor, $Q_1$. A diode-connected transistor $Q_2$ (i.e., p-n junction) is connected between ground and the base of the RF output transistor $Q_{RF}$. When such diode-connected transistor $Q_2$ conducts, a fixed, dc voltage is produced across it thereby fixing the dc voltage at the base of the RF output transistor $Q_{RF}$. Thus, when conducting the diode-connected transistor $Q_2$ provides a fixed reference voltage at the base electrode of the RF output transistor $Q_{RF}$. The RF transistor $Q_{RF}$ is biased to a fixed dc operating point by providing a fixed dc current $I_{BIAS}$ through the collector-emitter thereof. Here, the dc current is produced by applying a fixed current through the conducting diode connected transistor $Q_2$. The fixed dc current is supplied by a current source, i.e., a high impedance device, here represented by a resistor. The current source here produces the current indicated I. Thus, the amount of dc bias current required for the RF output transistor establishes the amount of current I provided by the current source. That is, the diode-connected transistor and the RF output transistor $Q_{RF}$ are arranged as current mirror 9 with the current through the collector of the RF transistor mirroring the current fed to the diode-connected transistor $Q_2$ from the current source.

When it is desired to switch the RF output transistor $Q_{RF}$ off, the transistor Q1 is driven on by a control voltage fed to the base thereof. Thus, the on condition of transistor Q1 places a low voltage at the base of RF output transistor $Q_{RF}$. The current I from the current source now passes through the conducting transistor Q1. Transistor Q1 must sink the current source current I which may be as high as 5–10 milliamps in some applications resulting in excessive battery power drain.

Another circuit is shown in FIG. 2. Here, the current mirror 9' is provided by a pair of transistors $Q_{2A}$ and $Q_{2B}$ and the RF output transistor $Q_{RF}$. Here, the current mirror 9' is sometimes referred to as an enhanced current mirror. With an enhanced current mirror the emitter follower transistor can supply extra base current as required when the RF transistor is driven under high power, large signal conditions.

Here again a fixed dc voltage is produced at the base of the output transistor $Q_{RF}$. The dc voltage is coupled to the base of the RF transistor as a fixed dc voltage and thereby provides a proper dc bias current for the RF output transistor. The amount of dc bias current required for the RF output transistor is established by the amount of current I from the current source, here again represented by a resistor. Here again, when it is desired to switch the RF output transistor off, the transistor Q1 is driven on by a control voltage fed to the base thereof. Thus, the on condition places a low voltage at the base of RF output transistor $Q_{RF}$. The current I from the current source now passes through the conducting transistor Q1. Transistor Q1 must sink the current source current I which may be as high as 5–10 milli-amps in some applications resulting in excessive battery power drain.

SUMMARY

In accordance with the present invention, an amplifier circuit is provided. The amplifier circuit includes a current mirror circuit. The current mirror circuit includes: a first current source for producing a reference current; an output transistor having an input electrode and an output electrode; and a current gain device connected between an output of the first current source and the input electrode of the output transistor. A bias current is produced through the output electrode of the output transistor, such bias current being a function of the reference current produced by the first current source. A second current source has an output coupled to an input of the current gain device. The second current source provides a current which is a fraction of the reference current. A switching transistor has an output electrode coupled to: (1) an input of the current gain device; and, (2) an output of the second current source. The switching transistor: (1) sinks the current from the second current source in response to an input signal fed to such switching transistor inhibiting current from the second current source to pass to the current gain device and thereby remove the bias current for the output transistor driving the output transistor to a non-conducting condition; or (2) enables the current from the second current source to pass to the current gain device in response to the input signal fed to such switching transistor driving the output transistor to a conducting condition.

In one embodiment, the gain device comprises a transistor.

In one embodiment, the gain device transistor is driven into saturation when the switching transistor enables the current from the second current source to pass to the current gain device in response to the input signal fed to such switching transistor driving the output transistor to a conducting condition.

In one embodiment, the gain device transistor comprises a bipolar transistor.

In accordance with the invention, a transistor is provided having the collector-emitter coupled between the fixed voltage at the output of the current source and the base of the RF transistor. This transistor has its base coupled to a second current source and to a switch for such transistor. When the RF is to turn on, the current from the second current source is fed to the base of the transistor to bias the transistor into saturation with the new circuit producing a fixed dc voltage at the base of the RF transistor and therefore provides a fixed dc bias current for the RF transistor. The amount of dc bias current required for the RF transistor establishes the amount of current required for the current source. Because the transistor is in saturation, the second current source is only a small fraction (I/beta) the amount of current required by the first current source to provide the requisite dc bias current for the RF transistor. When the switch turns the RF transistor off, the smaller current from the second current source is sunk by the switch.

The details of one or more embodiments of the invention are set forth in the accompanying drawings and the descrip-

DETAILED DESCRIPTION

Figure 1:
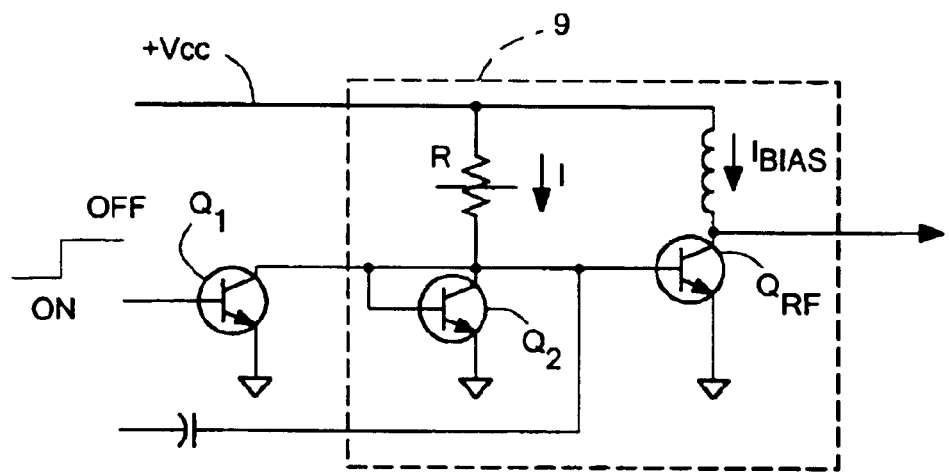
FIG. 1 is a schematic diagram of a switchable amplifier according to the PRIOR ART.
Figure 2:
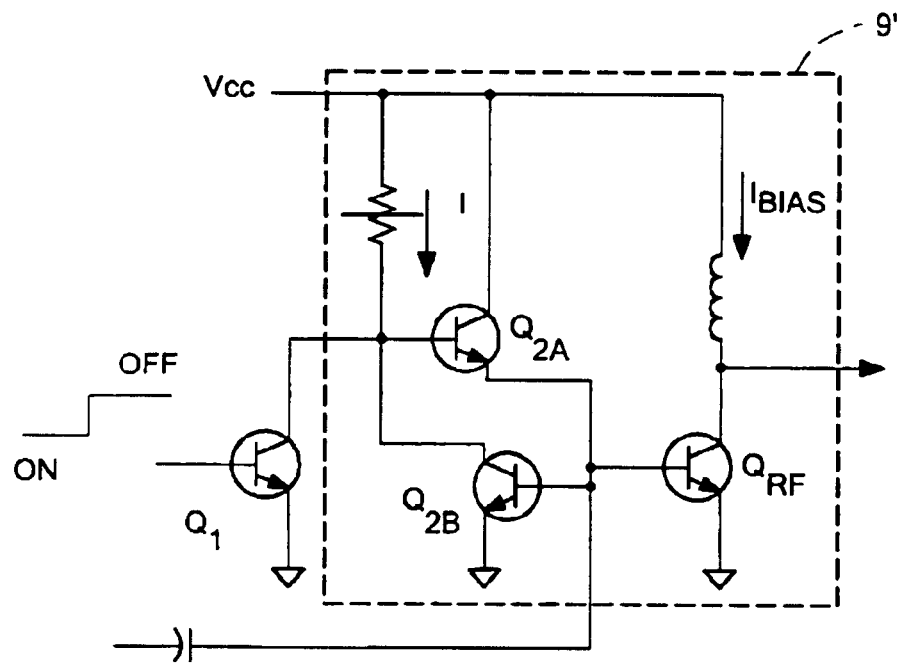
FIG. 2 is a schematic diagram of a switchable amplifier according to the PRIOR ART.
Figure 3:
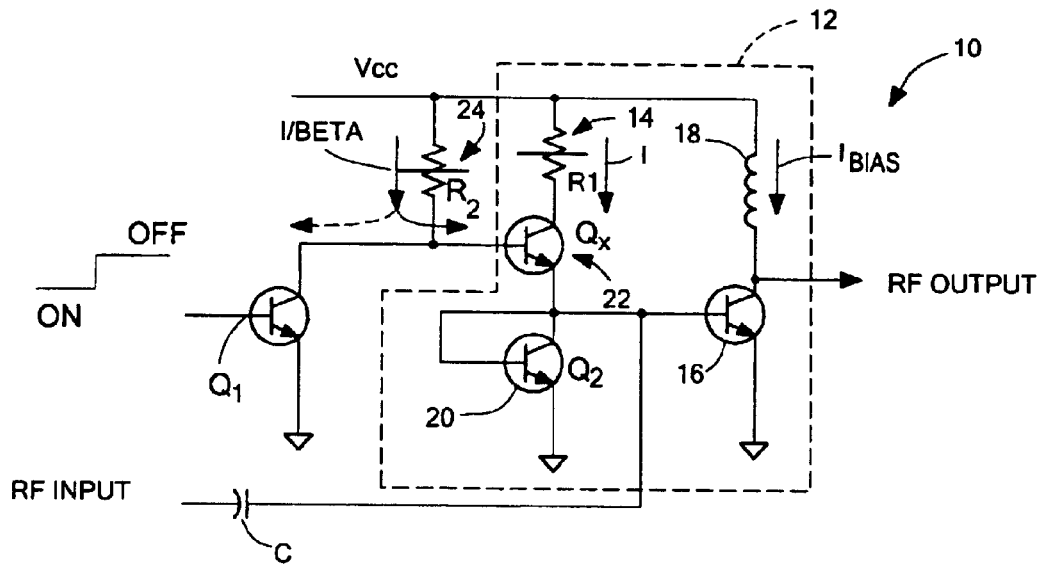
FIG. 3 is a schematic diagram of a switchable amplifier according to the invention.

Referring now to FIG. 3, an RF amnplifier circuit 10 is shown. The circuit 10 includes a current mirror circuit 12. The current mirror circuit 12 includes a first current source 14 for producing a reference current, I. The current source 14 is a high impedance device, here represented by a resistor $R_1$. The current mirror circuit 12 also includes an RF output transistor 16, here a bipolar transistor, preferably a heterojunction bipolar transistor (HBT) device. The output transistor 16 is arranged in a grounded emitter configuration with its collector connected to a Vcc supply voltage through an inductor 18, as shown. An RF input for amplification by the RF output transistor 16 is coupled to the base electrode of the RF output transistor 16 though an ac coupling capacitor, C, as shown. The current mirror circuit 12 also includes a reference voltage generator 20, here a diode-connected bipolar transistor $Q_2$ (i.e., p-n junction) coupled to a predetermined reference voltage, here ground, and the base electrode of the output transistor 16, as shown. The current mirror circuit 12 also includes a current gain device 22, here a bipolar transistor $Q_x$, connected between an output of the current source 14 and: (a) the base electrode of the output transistor 16; and (b) the reference voltage generator 20.

With such an arrangement, the current mirror circuit 12 provides a dc bias current, $I_{BIAS}$, through the collector electrode of the output transistor 18. The bias current $I_{BIAS}$ is a function of the reference current I produced by the current source 14. That is, the diode-connected transistor $Q_2$ provides a p-n junction and the RF output transistor 16 are arranged as current mirror 12 with the current $I_{BIAS}$ through the collector of the RF transistor 16 mirroring the current I fed to the diode-connected transistor 20 from the current source 14.

The amplifier 10 includes a second current source 24, here represented by a resistor $R_2$ having an output coupled to an input of the current gain device 22, here the bipolar transistor Qx. When conducting, the transistor Qx operates in saturation and thus the second current I' is a fraction of the reference current, I. Further, because the transistor Qx operates in saturation (i.e., the base-emitter junction and base- collector junctions of transistor Qx are both forward biased) there is a relatively fixed voltage across the collector and emitter electrodes thereof. That is, the transistor has a beta which is the ratio of I to the current provided by the second current source I', i.e., beta=I/I'. Thus, here for example, beta is about 50 so that the second current source produces a current I'=1/50.

The circuit 10 also includes a switching transistor, here a grounded emitter bipolar transistor $Q_1$ having an output electrode (here collector electrode) coupled to: (1) an input of the current gain device 22; and, (2) an output of the second current source 24. The switching transistor $Q_1$, in response to a control signal fed to its base electrode, either: (1) sinks the current I' (shown by the dotted arrow) from the second current source 24 in response to a control signal fed to the base of the switching transistor $Q_1$ inhibiting current from the second current source 24 from passing to the current gain device 22 and thereby removing the bias current for the output transistor 16 driving the output transistor 16 to a non-conducting condition; or (2) enables the current from the second current source 24 (shown by the solid arrow) to pass to the current gain device 22 in response to the control signal fed to the base of the switching transistor $Q_1$ driving the output transistor 16 to a conducting condition.

Figure 4:
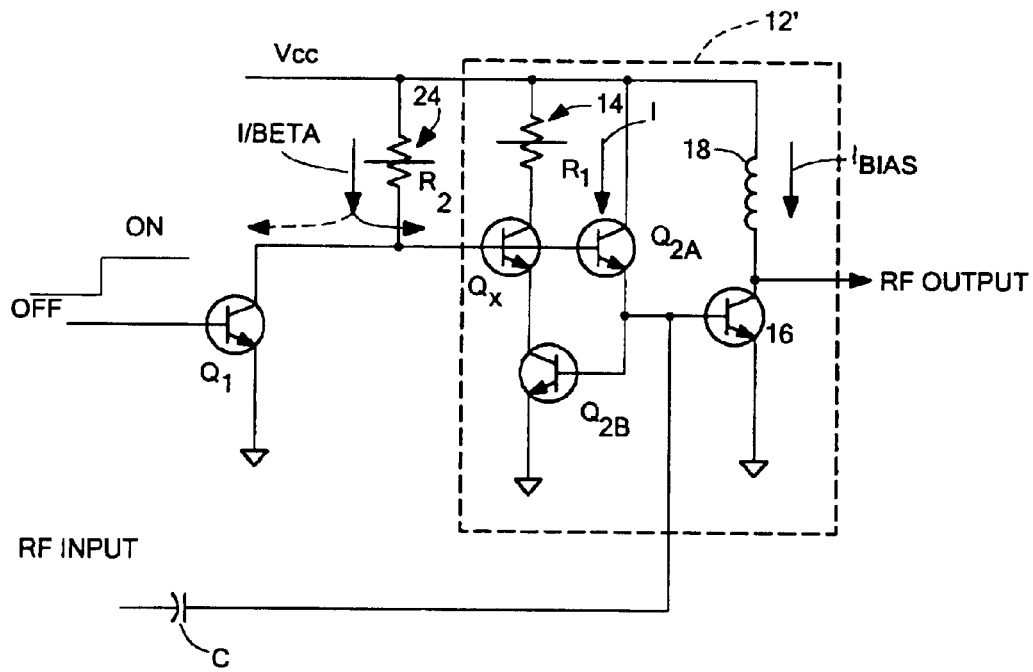
FIG. 4 is a schematic diagram of a switchable amplifier according to another embodiment of the invention, Like reference symbols in the various drawings indicate like elements.

Referring now to FIG. 4 another switching amplifier 10' is shown. Here, the current mirror 12' is here an enhanced current mirror and includes a pair of transistors $Q_{2A}$ and $Q_{2B}$ to provide the fixed dc reference voltage at the base of the RF output transistor 16. The dc voltage is coupled to the base of the RF transistor as a fixed dc voltage and thereby provides a proper dc bias current for the RF output transistor. The amount of dc bias current required for the RF output transistor 16 is established by the amount of current I from the current source 14, here again represented by a resistor, $R_1$ Here again, when it is desired to switch the RF output transistor 16 off, the transistor $Q_1$ is driven on by a control voltage fed to the base thereof The amplifier 10' includes a second current source 24, here represented by a resistor $R_2$ having an output coupled to an input of the current gain device 22, here the bipolar transistor Qx. When conducting, the transistor $Q_x$ operates in saturation and thus the second current I' is a fraction of the reference current, I. That is, the transistor has a beta which is the ratio of I to the current provided by the second current source I', i.e., beta=I/I'. Thus, here for example, beta is about 50 so that the second current source produces a current I'=I/50.

The circuit 10' also includes a switching transistor, here a grounded emitter bipolar transistor $Q_1$ having an output electrode (here collector electrode) coupled to: (1) an input of the current gain device 22; and, (2) an output of the second current source 24. The switching transistor $Q_1$, in response to a control signal fed to its base electrode, either: (1) sinks the current I' (shown by the dotted arrow) from the second current source 24 in response to a control signal fed to the base of the switching transistor $Q_1$ inhibiting current from the second current source 24 from passing to the current gain device 22 and thereby removing the bias current for the output transistor 16 driving the output transistor 16 to a non-conducting condition; or (2) enables the current from the second current source 24 (shown by the solid arrow) to pass to the current gain device 22 in response to the control signal fed to the base of the switching transistor $Q_1$ driving the output transistor 16 to a conducting condition.

A number of embodiments of the invention have been described. Nevertheless, it will be understood that various modifications may be made without departing from the spirit and scope of the invention. Accordingly, other embodiments are within the scope of the following claims.

What is claimed is:

1. An amplifier circuit, comprising:
   (a) a current mirror circuit comprising:
      (i) a first current source for producing a reference current;
      (ii) an output transistor having an input electrode and an output electrode;

(iii) a current gain device connected between an output of the first current source and the input electrode of the output transistor; (v) wherein a bias current is produced through the output electrode of the output transistor, such bias current being a function of the reference current produced by the first current source;

(b) a second current source having an output coupled to an input of the current gain device, such second current source providing a current which is a fraction of the reference current; and (c) a switching transistor having an output electrode coupled to: (1) an input of the current gain device; and, (2) an output of the second current source, such switching transistor: (1) sinking the current from the second current source in response to an input signal fed to such switching transistor inhibiting current from the second current source to pass to the current gain device and thereby remove the bias current for the output transistor driving the output transistor to a non-conducting condition; or (2) enabling the current from the second current source to pass to the current gain device in response to the input signal fed to such switching transistor driving the output transistor to a conducting condition.

2. The amplifier circuit recited in claim 1 wherein the gain device comprises a transistor.

3. The amplifier circuit recited in claim 2 wherein the gain device transistor is driven into saturation when the switching transistor enables the current from the second current source to pass to the current gain device in response to the input signal fed to such switching transistor driving the output transistor to a conducting condition.

4. The amplifier circuit recited in claim 2 wherein the gain device transistor comprises a bipolar transistor.

5. The amplifier recited in claim 3 wherein the gain device transistor comprises a bipolar transistor.

6. The amplifier circuit recited in claim 3 wherein the switching transistor comprises a bipolar transistor.

7. The amplifier circuit recited in claim 3 wherein the output transistor comprises a bipolar transistor.

8. The amplifier circuit recited in claim 7 wherein the switching transistor comprises a bipolar transistor.

9. An amplifier circuit, comprising:

(a) a current mirror circuit comprising:
  (i) a first current source for producing a reference current;
  (ii) an output transistor having an input electrode and an output electrode;
  (iii) a bipolar transistor connected between an output of the first current source and the input electrode of the output transistor;
  (iv) wherein a bias current is produced through the output electrode of the output transistor, such bias current being a function of the reference current produced by the first current source;

(b) a second current source having an output coupled to an input of the bipolar transistor, such second current source providing a current which is a fraction of the reference current; and (c) a switching transistor having an output electrode coupled to: (1) an input of the current gain device; and, (2) an output of the second current source, such switching transistor: (1) sinking the current from the second current source in response to an input signal fed to such switching transistor inhibiting current from the second current source to pass to the bipolar transistor and thereby remove the bias current for the output transistor driving the output transistor to a non-conducting condition; or (2) enabling the current from the second current source to pass to the bipolar transistor to drive such bipolar transistor into saturation in response to the input signal fed to such switching transistor driving the output transistor to a conducting condition.

10. An amplifier circuit, comprising:

(a) a first current source for producing a reference current;

(b) an output transistor having an input electrode and an output electrode;

(c) a bipolar transistor connected between an output of the first current source and to:
  (1) the input electrode of the output transistor; and
  (2) the p-n junction;

(d) wherein a bias current is produced through the output electrode of the output transistor, such bias current being a function of the reference current produced by the first current source;

(e) a second current source having an output coupled to an input of the current gain device, such second current source providing a current which is a fraction of the reference current; and (f) a switching transistor having an output electrode coupled to: (1) an input of the bipolar transistor; and, (2) an output of the second current source, such switching transistor: (1) sinking the current from the second current source in response to an input signal fed to such switching transistor inhibiting current from the second current source to pass to the bipolar transistor and thereby remove the bias current for the output transistor driving the output transistor to a non-conducting condition; or (2) enabling the current from the second current source to pass to the bipolar transistor, such bipolar transistor operating in saturation, in response to the input signal fed to such switching transistor driving the output transistor to a conducting condition.

* * * * *